United States Patent
Suchentrunk et al.

(10) Patent No.: US 9,758,874 B2
(45) Date of Patent: Sep. 12, 2017

(54) PLATING BATH COMPOSITION AND METHOD FOR ELECTROLESS PLATING OF PALLADIUM

(71) Applicant: Atotech Deutschland GmbH, Berlin (DE)

(72) Inventors: Christof Suchentrunk, Berlin (DE); Katharina Grummt, Leipzig (DE); Julia Cramer, Berlin (DE)

(73) Assignee: Atotech Deutschland GmbH, Berlin (DE)

(*) Notice: Subject to any disclaimer, the term of this patent is extended or adjusted under 35 U.S.C. 154(b) by 0 days.

(21) Appl. No.: 15/120,135

(22) PCT Filed: Apr. 7, 2015

(86) PCT No.: PCT/EP2015/057488
§ 371 (c)(1),
(2) Date: Aug. 19, 2016

(87) PCT Pub. No.: WO2015/155173
PCT Pub. Date: Oct. 15, 2015

(65) Prior Publication Data
US 2017/0121823 A1    May 4, 2017

(30) Foreign Application Priority Data
Apr. 10, 2014  (EP) .................... 14164252

(51) Int. Cl.
*C23C 18/44* (2006.01)
*C23C 18/16* (2006.01)
*C23C 18/54* (2006.01)
*H01L 21/288* (2006.01)
*H05K 3/18* (2006.01)
*H05K 3/24* (2006.01)

(52) U.S. Cl.
CPC .......... *C23C 18/44* (2013.01); *C23C 18/1637* (2013.01); *C23C 18/1651* (2013.01); *H01L 21/288* (2013.01); *H05K 3/187* (2013.01); *H05K 3/24* (2013.01); *C23C 18/54* (2013.01); *H05K 3/244* (2013.01)

(58) Field of Classification Search
CPC . C23C 18/44; C23C 18/1637; C23C 18/1651; C23C 18/54; H01L 21/288; H05K 3/187; H05K 3/24; H05K 3/244
USPC ....................................... 106/1.24
See application file for complete search history.

(56) References Cited

U.S. PATENT DOCUMENTS

| | | | |
|---|---|---|---|
| 4,118,234 A | 10/1978 | Jans | |
| 4,255,194 A * | 3/1981 | Hough | C23C 18/44 106/1.24 |
| 4,424,241 A | 1/1984 | Abys | |
| 5,130,168 A | 7/1992 | Mathe et al. | |
| 5,601,637 A * | 2/1997 | Wachi | C23C 18/44 106/1.23 |
| 5,882,736 A | 3/1999 | Stein et al. | |
| 7,678,183 B2 * | 3/2010 | Murasumi | C23C 18/1651 106/1.24 |
| 7,981,202 B2 * | 7/2011 | Kojima | C23C 18/42 106/1.24 |
| 8,562,727 B2 * | 10/2013 | Watanabe | C23C 18/44 106/1.24 |
| 8,888,903 B2 * | 11/2014 | Hirsekorn | C23C 18/44 106/1.24 |
| 8,986,789 B2 * | 3/2015 | Uhlig | C23C 18/44 427/304 |
| 2002/0132042 A1 * | 9/2002 | Merricks | C23C 18/1653 106/1.23 |
| 2011/0200842 A1 | 8/2011 | Uhlig et al. | |

FOREIGN PATENT DOCUMENTS

| | | |
|---|---|---|
| EP | 2177646 | 4/2010 |
| JP | 2009-149958 | * 7/2009 |
| WO | 9426954 | 11/1994 |

OTHER PUBLICATIONS

PCT/EP2015/057488; PCT International Search Report and Written Opinion of the International Searching Authority dated Jun. 25, 2015.
PCT/EP2015/057488; PCT International Preliminary Report on Patentability dated May 12, 2016.

* cited by examiner

*Primary Examiner* — Helene Klemanski
(74) *Attorney, Agent, or Firm* — Renner, Otto, Boisselle & Sklar, LLP

(57) ABSTRACT

The present invention relates to a plating bath composition and a method for depositing a palladium layer by electroless plating onto a substrate. The aqueous acidic plating bath according to the present invention comprises a source for palladium ions, a reducing agent, a nitrogenated complexing agent for palladium ions and a water-soluble stabilizing agent selected from the group consisting of aromatic compounds comprising at least two residues wherein at least one residue is a hydrophilic residue and at least one residue has a negative mesomeric effect. The plating bath has an increased stability against undesired decomposition while maintaining a sufficient plating rate.

13 Claims, No Drawings

PLATING BATH COMPOSITION AND METHOD FOR ELECTROLESS PLATING OF PALLADIUM

The present application is a U.S. National Stage Application based on and claiming benefit and priority under 35 U.S.C. §371 of International Application No. PCT/EP2015/057488, filed 7 Apr. 2015, which in turn claims benefit of and priority to European Application No. 14164252.0 filed 10 Apr. 2014, the entirety of both of which is hereby incorporated herein by reference.

FIELD OF THE INVENTION

The present invention relates to plating bath compositions and a method for electroless plating of palladium in the manufacture of printed circuit boards, IC substrates and for metallization of semiconductor wafers.

BACKGROUND OF THE INVENTION

Electroless deposition of palladium in the manufacture of printed circuit boards, IC substrates and the like as well as metallisation of semiconductor wafers is an established technique. The palladium layers are used for example as barrier layers and/or wire-bondable and solderable finishes.

Electroless palladium plating bath compositions comprising a source for palladium ions, a nitrogenated complexing agent and a reducing agent selected from formic acid and derivatives thereof are disclosed in U.S. Pat. No. 5,882,736. Such electroless palladium plating bath compositions are suited to deposit pure palladium in contrast to plating bath compositions containing hypophosphite as reducing agent which result in palladium-phosphorous alloy layers.

The stability of plating bath compositions comprising palladium ions is an important feature of such plating bath compositions due to the high price of palladium and the requirement for palladium layers deposited having predictable properties such as internal stress, and a high adhesion to the underlying substrate whereon the palladium layer is deposited.

The stability of such a plating bath means that the plating bath is stable against decomposition, i.e. the undesired precipitation of metallic palladium in the plating bath itself. Accordingly, a stable plating bath has a longer life time than an unstable plating bath. At the same time, the deposition rate of palladium from such a plating bath should be high enough, for example more than 10 nm/min, in order to fulfil the requirements for an industrial palladium plating method.

OBJECTIVE OF THE PRESENT INVENTION

It is the objective of the present invention to provide a plating bath composition and method for electroless plating of palladium wherein the plating bath stability against undesired decomposition is increased while maintaining the properties of the palladium layer deposited onto a substrate.

SUMMARY OF THE INVENTION

This objective is solved with an aqueous acidic plating bath composition for electroless deposition of palladium, comprising
  (i) a source for palladium ions,
  (ii) a nitrogenated complexing agent for palladium ions,
  (iii) a reducing agent selected from the group consisting of formic acid, derivatives and salts thereof,
  (iv) a water-soluble stabilizing agent selected from the group consisting of aromatic compounds comprising at least two residues wherein at least one residue is a hydrophilic residue and at least one residue has a negative mesomeric effect, and
    wherein the at least one hydrophilic residue is selected from the group consisting of hydroxyl, carboxyl, sulfonate and salts thereof; and
    wherein the at least one residue having a negative mesomeric effect is selected from the group consisting of nitro, nitrile, acetyl, carboxyl and sulfonate.

This objective is further solved by the method for electroless palladium plating comprising, in this order, the steps of
  a) providing a substrate having a metal surface,
  b) providing an aqueous acidic plating bath composition comprising
    (i) a source for palladium ions,
    (ii) at least one nitrogenated complexing agent for palladium ions,
    (iii) a reducing agent selected from the group consisting of formic acid, derivatives and salts thereof,
    (iv) a water-soluble stabilizing agent selected from the group consisting of aromatic compounds comprising at least two residues wherein at least one residue is a hydrophilic residue and at least one residue has a negative mesomeric effect, and
      wherein the at least one hydrophilic residue is selected from the group consisting of hydroxyl, carboxyl, sulfonate and salts thereof; and
      wherein the at least one residue having a negative mesomeric effect is selected from the group consisting of nitro, nitrile, acetyl, carboxyl and sulfonate; and
  c) contacting said substrate with said aqueous acidic plating bath composition and thereby depositing a layer of palladium onto the metal surface of the substrate.

The plating bath according to the present invention has an improved stability against undesired decomposition due to the water-soluble stabilizing agent while maintaining a sufficiently high deposition rate for palladium onto a substrate. Furthermore, the stable performance of the aqueous acidic plating bath in the method for electroless palladium plating according to the present invention allows deposition of palladium layers with desired properties such as internal stress and adhesion to the underlying substrate over a long period of time.

DETAILED DESCRIPTION OF THE INVENTION

The aqueous electroless palladium plating bath according to the present invention contains a source for palladium ions which is a water soluble palladium compound such as palladium chloride, palladium nitrate, palladium acetate, palladium sulfate and palladium perchlorate. Optionally, complex compounds comprising a palladium ion and a nitrogenated complexing agent for palladium ions can be added to the plating bath instead of forming such a complex compound in the plating bath by adding a palladium salt and said nitrogenated complexing agent for palladium ions to the plating bath as separate ingredients. Suitable complex compounds as sources for palladium ions are for example di-chlorodiethylenediamine palladium, dinitrodiethylenediamine palladium and diacetatodiethylenediamine palladium.

The concentration of palladium ions in the plating bath ranges from 0.5 to 500 mmol/l, preferably from 1 to 100 mmol/l.

The electroless palladium plating bath further comprises a nitrogenated complexing agent for palladium ions. Said nitrogenated complexing agent is selected from the group comprising primary amines, secondary amines and tertiary amines. Suitable amines are for example ethylene-diamine, 1,3-diamino-propane, 1,2-bis (3-amino-propyl-amino)-ethane, 2-diethyl-amino-ethyl-amine, diethylene-triamine, diethylene-triamine-penta-acetic acid, nitro-acetic acid, N-(2-hydroxy-ethyl)-ethylene-diamine, ethylene-diamine-N,N-diacetic acid, 2-(dimethyl-amino)-ethyl-amine, 1,2-di-amino-propyl-amine, 1,3-diamino-propyl-amine, 3-(methyl-amino)-propyl-amine, 3-(dimethyl-amino)-propyl-amine, 3-(diethyl-amino)-propyl-amine, bis-(3-amino-propyl)-amine, 1,2-bis-(3-amino-propyl)-alkyl-amine, diethylene-triamine, triethylene-tetraamine, tetra-ethylene-pentaamine, penta-ethylene-hexamine and mixtures thereof.

The mole ratio of the nitrogenated complexing agent for palladium ions and palladium ions in the electroless plating bath according to the present invention ranges from 2:1 to 50:1.

The electroless plating bath according to the present invention further comprises a reducing agent which makes the plating bath an autocatalytic, i.e. an electroless plating bath. Palladium ions are reduced to metallic palladium in the presence of said reducing agent. This plating mechanism differentiates the plating bath according to the present invention from 1) immersion-type palladium plating baths which do not contain a reducing agent for palladium ions and 2) plating baths for electroplating of palladium which require an external electrical current in order to deposit a palladium layer.

The electroless plating bath according to the present invention is particularly suitable for depositing palladium layers in the presence of formic acid, derivatives and salts thereof as reducing agent. Suitable derivatives of formic acid are for example esters of formic acid, such as formic acid methylester, formic acid ethylester and formic acid propylester. Other suitable derivatives of formic acid are for example substituted and un-substituted amides such as formamide. Suitable counter ions for salts of formic acid are for example selected from hydrogen, lithium, sodium, potassium and ammonium.

The reducing agent is added to the electroless plating bath in a concentration of 10 to 1000 mmol/l.

Hypophosphite ions and/or amine borane compounds and/or sodium borohydride are not suitable as the reducing agent because a palladium alloy layer is deposited from such plating bath compositions. Preferably, the electroless palladium plating bath according to the present invention does also not contain the reducing agent formaldehyde because of the toxicity of this compound.

The aqueous acidic plating bath according to the present invention further comprises a water-soluble stabilizing agent selected from the group consisting of aromatic compounds comprising at least two residues wherein at least one residue is a hydrophilic residue and at least one residue has a negative mesomeric effect.

The term "water-soluble" in respect to stabilizing agents is defined herein as water-soluble in the required concentration of said water-soluble stabilizing agent added to the aqueous acidic plating bath composition according to the present invention.

The term "aromatic compounds" is defined herein as derivatives of benzene and poly-aromatic hydrocarbons such as naphthalene.

Said derivatives of benzene, naphthalene and the like comprise at least two residues wherein at least one is a hydrophilic residue and at least one further residue is a residue having a negative mesomeric effect. The at least one hydrophilic residue increases the solubility of the water-soluble stabilizing agents according to the present invention.

Hydrophilic residues are selected from the group consisting of hydroxyl, carboxyl, sulfonate and salts thereof. Preferably, the hydrophilic residues are selected from the group consisting of hydroxyl, carboxyl and salts thereof.

Residues having a negative mesomeric effect are selected from the group consisting of nitro, nitrile, acetyl, carboxyl and sulfonate. Preferably, the residues having a negative mesomeric effect are selected from the group consisting of nitro, nitrile, acetyl and carboxyl.

In another embodiment of the present invention, the residues having a negative mesomeric effect are preferably selected from the group consisting of nitrile, acetyl and carboxyl. Water-soluble stabilizing agents selected from the group consisting of aromatic compounds comprising at least one hydrophilic residue and a nitro group as at least one residue having a negative mesomeric effect may cause a yellow discoloring of the aqueous acidic plating bath composition for electroless deposition of palladium which is undesirable.

The water-soluble stabilizing agent may comprise more than one of the aforementioned hydrophilic residues and/or more than one of the aforementioned residues having a negative mesomeric effect.

The aforementioned hydrophilic residues and the aforementioned residues having a negative mesomeric effect can be present in said stabilizing agent in any combination which leads to molecules stable in an aqueous acidic solution when adding said molecules to said aqueous acidic solution which can be the plating bath according to the present invention. Accordingly, all members of the list with the aforementioned hydrophilic residues can be combined with all members of the list with the aforementioned residues having a negative mesomeric effect.

Water-soluble stabilizing agents are also those aromatic compounds comprising e.g. at least two sulfonate residues or at least two carboxyl residues because such residues are both hydrophilic residues and residues having a negative mesomeric effect according to the present invention.

Hydrophilic residues such as hydroxyl, carboxyl, sulfonate can be converted to corresponding salts such as alkali metal salts by contacting the water-soluble stabilizing agent with an alkaline aqueous solution (e.g. an aqueous solution of NaOH, KOH or NH$_4$OH). Said corresponding salts have a higher solubility in acidic aqueous solutions compared with the corresponding protonated compounds.

More preferably, the water-soluble stabilizing agent is selected from the group consisting of 2-nitrophenol, 3-nitrophenol, 4-nitrophenol, 3,5-dinitrophenol, 2,4-dinitrophenol, 2,4,6-trinitrophenol, 2-nitrobenzoic acid, 3-nitrobenzoic acid, 4-nitrobenzoic acid, 3,5-dinitrobenzoic acid, 2,4-dinitrobenzoic acid, 2,4,6-trinitrobenzoic acid, 2-hydroxy-3,5-dinitrobenzoic acid, 2-nitrobenzosulfonic acid, 3-nitrobenzosulfonic acid, 4-nitrobenzosulfonic acid, 3,5-dinitrobenzosulfonic acid, 2,4-dinitrobenzosulfonic acid, 2,4,6-trinitrobenzosulfonic acid, 2-acetylbenzoicacid, 3-acetylbenzoic acid, 4-acetylbenzoic acid, 3,5-diacetylbenzoic acid, 2,4-diacetylbenzoic acid, 2,4,6-triacetylbenzoic acid, 2-acetylphenol, 3-acetylphenol, 4-acetylphenol, 3,5- diacetylphenol, 2,4-diacetylphenol, 2,4,6-triacetylphenol, 2-acetylbenzosulfonic acid, 3-acetylbenzosulfonic acid, 4-acetyl-benzosulfonic acid, 3,5-diacetylbenzosulfonic acid, 2,4-diacetylbenzosulfonic acid 2,4,6-triacetylbenzosulfonic acid, 2-cyanobenzoic acid, 3-cyanobenzoic acid, 4-cyanobenzoic acid, 2-hydroxybenzonitrile, 3-hydroxybenzonitrile, 4-hydroxybenzonitrile, and their corresponding ammonium, sodium and potassium salts.

Even more preferably, the water-soluble stabilizing agent is selected from the group consisting of 2-nitrophenol, 3-nitrophenol, 4-nitrophenol, 3,5-dinitrophenol, 2,4-dinitrophenol, 2,4,6-trinitrophenol, 2-nitrobenzoic acid, 3-nitrobenzoic acid, 4-nitrobenzoic acid, 3,5-dinitrobenzoic acid, 2,4-dinitrobenzoic acid, 2,4,6-trinitrobenzoic acid, 2-hydroxy-3,5-dinitrobenzoic acid, 2-nitrobenzosulfonic acid, 3-nitrobenzosulfonic acid, 4-nitrobenzosulfonic acid, 3,5-dinitrobenzosulfonic acid, 2,4-dinitrobenzosulfonic acid, 2,4,6-trinitrobenzosulfonic acid, 2-acetylbenzoic acid, 3-acetylbenzoic acid, 4-acetylbenzoic acid, 3,5-diacetylbenzoic acid, 2,4-diacetylbenzoic acid, 2,4,6-triacetylbenzoic acid, 2-acetylphenol, 3-acetylphenol, 4-acetylphenol, 3,5-diacetylphenol, 2,4-diacetylphenol, 2,4,6-triacetylphenol, 2-acetylbenzosulfonic acid, 3-acetylbenzosulfonic acid, 4-acetyl-benzosulfonic acid, 3,5-diacetylbenzosulfonic acid, 2,4-diacetylbenzosulfonic acid 2,4,6-triacetylbenzosulfonic acid and their corresponding ammonium, sodium and potassium salts.

Still more preferably, the water-soluble stabilizing agent is selected from the group consisting of 2-nitrophenol, 3-nitrophenol, 4-nitrophenol, 3,5-dinitrophenol, 2,4-dinitrophenol, 2,4,6-trinitrophenol, 2-nitrobenzoic acid, 3-nitrobenzoic acid, 4-nitrobenzoic acid, 3,5-dinitrobenzoic acid, 2,4-dinitrobenzoic acid, 2,4,6-trinitrobenzoic acid, 2-hydroxy-3,5-dinitrobenzoic acid, 2-acetylbenzoic acid, 3-acetylbenzoic acid, 4-acetylbenzoic acid, 3,5-diacetylbenzoic acid, 2,4-diacetylbenzoic acid, 2,4,6-triacetylbenzoic acid, 2-acetylphenol, 3-acetylphenol, 4-acetylphenol, 3,5-diacetylphenol, 2,4-diacetylphenol, 2,4,6-triacetylphenol, 2-cyanobenzoic acid, 3-cyanobenzoic acid, 4-cyanobenzoic acid, 2-hydroxybenzonitrile, 3-hydroxybenzonitrile, 4-hydroxybenzonitrile, and their corresponding ammonium, sodium and potassium salts.

Still more preferably, the water-soluble stabilizing agent is selected from the group consisting of 2-nitrophenol, 3-nitrophenol, 4-nitrophenol, 3,5-dinitrophenol, 2,4-dinitrophenol, 2,4,6-trinitrophenol, 2-nitrobenzoic acid, 3-nitrobenzoic acid, 4-nitrobenzoic acid, 3,5-dinitrobenzoic acid, 2,4-dinitrobenzoic acid, 2,4,6-trinitrobenzoic acid, 2-hydroxy-3,5-dinitrobenzoic acid, 2-acetylbenzoic acid, 3-acetylbenzoic acid, 4-acetylbenzoic acid, 3,5-diacetylbenzoic acid, 2,4-diacetylbenzoic acid, 2,4,6-triacetylbenzoic acid, 2-acetylphenol, 3-acetylphenol, 4-acetylphenol, 3,5-diacetylphenol, 2,4-diacetylphenol, 2,4,6-triacetylphenol, and their corresponding ammonium, sodium and potassium salts.

Most preferably, the water-soluble stabilizing agent is selected from the group consisting of 2-nitrobenzoic acid, 3-nitrobenzoic acid, 4-nitrobenzoic acid, 3,5-dinitrobenzoic acid, 2,4-dinitrobenzoic acid, 2,4,6-trinitrobenzoic acid, 2-hydroxy-3,5-dinitrobenzoic acid and their corresponding ammonium, sodium and potassium salts.

In another embodiment of the present invention, the water-soluble stabilizing agent is preferably selected from the group consisting of 2-acetylbenzoic acid, 3-acetylbenzoic acid, 4-acetylbenzoic acid, 3,5-diacetylbenzoic acid, 2,4-diacetylbenzoic acid, 2,4,6-triacetylbenzoic acid, 2-acetylphenol, 3-acetylphenol, 4-acetylphenol, 3,5-diacetylphenol, 2,4-diacetylphenol, 2,4,6-triacetylphenol, 2-cyanobenzoic acid, 3-cyanobenzoic acid, 4-cyanobenzoic acid, 2-hydroxybenzonitrile, 3-hydroxybenzonitrile, 4-hydroxybenzonitrile, and their corresponding ammonium, sodium and potassium salts; more preferably 2-acetylbenzoic acid, 3-acetylbenzoic acid, 4-acetylbenzoic acid, 3,5-diacetylbenzoic acid, 2,4-diacetylbenzoic acid, 2,4,6-triacetylbenzoic acid, 2-acetylphenol, 3-acetylphenol, 4-acetylphenol, 3, 5-diacetylphenol, 2,4-diacetylphenol, 2,4,6-triacetylphenol, and their corresponding ammonium, sodium and potassium salts.

The concentration of said water-soluble stabilizing agent in the plating bath according to the present invention ranges from 1 to 200 mg/l, more preferably from 5 to 150 mg/l and most preferably from 10 to 100 mg/l.

More than one water-soluble stabilizing agent selected from aromatic compounds comprising at least two residues wherein at least one residue is a hydrophilic residue and at least one residue has a negative mesomeric effect can be used in the plating bath according to the present invention.

Optionally, the water-soluble stabilizing agent selected from aromatic compounds comprising at least two residues wherein at least one residue is a hydrophilic residue and at least one residue has a negative mesomeric effect is present in the plating bath according to the present invention together with at least one further stabilizing agent selected from the group comprising compounds of the elements selenium, tellurium, copper, nickel, iron and chromium and/or mercapto-benzothiazole, seleno-cyanates, thiourea and ferro-cyanates. The concentration of such optional further stabilizing agents in the plating bath according to the present invention ranges from 0.1 to 200 mg/l.

Preferably, however, the aqueous acidic plating bath according to the present invention is essentially free of the aforementioned further stabilizing agents selected from the group comprising compounds of the elements selenium, tellurium, copper, nickel, iron and chromium and/or mercapto-benzothiazole, seleno-cyanates, thiourea and ferro-cyanates because such further stabilizing agents are either co-deposited with palladium (e.g. copper ions) and thereby form a palladium alloy which is not preferred, or are toxic substances (e.g. thiourea).

The aqueous plating bath according to the present invention is an acidic plating bath. The pH-value of the electroless plating bath preferably ranges from 4 to 7 because the plating bath is unstable at a DD-value below 4. More preferably, the pH-value of the plating bath ranges from 5 to 6. At pH-values greater than 7, the plating bath is prone to deposit palladium on the underlying substrate by immersion-type plating leading to a weak adhesion between the palladium layer and the underlying substrate. Furthermore, a plating bath composition having a pH-value above 7 would attack organic resist materials such as solder mask materials which may also be a part of the substrate.

Deposition of palladium is preferably carried out by contacting a substrate having a metal surface in the electroless plating bath according to the present invention. The metal surface to be coated with palladium is selected from the group comprising copper, copper alloys, nickel, nickel alloys, cobalt and cobalt alloys. The metal surface to be coated is for example part of a printed circuit board, an IC substrate or a semiconducting wafer.

Suitable methods for contacting the substrate with the electroless plating bath are for example dipping the substrate into the aqueous plating bath composition or spraying the aqueous plating bath composition onto the substrate.

The palladium plating process is conducted at a temperature of 35 to 95° C. for 1 to 60 min to give a palladium plated layer ranging in thickness from 0.01 to 5.0 µm, more preferably from 0.02 to 1.0 µm and even more preferably from 0.05 to 0.5 µm.

In one embodiment of the present invention, a thin activation layer of palladium is first deposited onto the substrate having a metal surface by an immersion-type plating method (exchange reaction) followed by palladium deposition from the electroless plating bath according to the present invention.

Activation methods for the metal surface prior to electroless palladium deposition are known in the art and can be applied to work the present invention. A suitable aqueous activation bath may comprise a palladium salt such as palladium acetate, palladium sulfate and palladium nitrate, a complexing agent for palladium ions such as primary amines, secondary amines, tertiary amines and ethanolamines and an acid such as nitric acid, sulfuric acid and methane sulfonic acid. Optionally, such an activation bath further contains an oxidizing agent such as nitrate ions, perchlorate ions, chlorate ions, perborate ions, periodate ions, peroxo-disulfate ions and peroxide ions.

The concentration of the palladium salt in the aqueous activation bath ranges from 0.005 to 20 g/l, preferably from 0.05 to 2.0 g/l. The concentration of the complexing agent for palladium ions ranges from 0.01 to 80 g/l, preferably from 0.1 to 8 g/l.

The pH-value of the aqueous activation bath preferably ranges from 0 to 5, preferably from 1 to 4.

Typically, the substrates are immersed in the aqueous activation bath at 25 to 30° C. for one to four minutes. Prior to immersing the substrate in an aqueous activation bath, the metal surface of the substrate is cleaned. For this purpose, etch cleaning is usually carried out in oxidizing, acidic solutions, for example a solution of sulfuric acid and hydrogen peroxide. Preferably, this is followed by another cleaning in an acidic solution, such as, for example, a sulfuric acid solution.

The stabilizing agent in the plating bath according to the present invention increases the life time of such plating baths because the undesired decomposition of the plating bath is suppressed. The method for electroless palladium plating according to the present invention enables plating of palladium layers having the desired physical properties such as internal stress, and a sufficient adhesion to the underlying substrate over an extended period of time in comparison to methods for electroless palladium plating known in the art.

EXAMPLES

The present invention is further explained by the following non-limiting examples.
General Procedure
Plating Bath Matrix:

A plating bath matrix having a pH-value in the range of 5 to 6 and comprising water, palladium ions, sodium formate and ethylenediamine as the nitrogenated complexing agent for palladium ions was used throughout all examples. The stability against undesired bath decomposition for the plating bath matrix without any stabilizing agents was tested in Example 1. Different amounts of stabilizing agents were added to said plating bath matrix throughout examples 2 to 9 and the stability against undesired decomposition was tested accordingly.

Test for Determining the Stability Against Undesired Decomposition:

250 ml of the aqueous acidic palladium plating bath were heated up to the desired test temperature of 60° C. while stirring the plating bath. Next, 1 ml of a palladium colloid solution (60 mg/l palladium) was added to the aqueous acidic plating bath every 60 s until a grey precipitate was formed in the aqueous acidic plating bath indicating the undesired decomposition of a given plating bath. The stability number corresponds to the amount of test solution added (in ml of palladium colloid solution) until formation of a grey precipitate, i.e. undesired decomposition of the plating bath. Accordingly, an amount of 6 ml palladium colloid solution added to a given plating bath until formation of the grey precipitate corresponds to a stability number of 6.

The stability against undesired decomposition of palladium plating baths is expressed in terms of the stability number.

Example 1 (Comparative)

The plating bath matrix was tested for stability against undesired decomposition without addition of a stabilizing agent. The stability number of such a plating bath matrix was 10.

Example 2 (Comparative)

30 mg/l of 1,3,5-trihydroxybenzene (an aromatic molecule with three hydrophilic residues but without a residue having a negative mesomeric effect) were added to the plating bath matrix. The stability number of such a plating bath was 10.

Example 3 (Comparative)

30 mg/l of nitrobenzene (an aromatic molecule with one residue having a negative mesomeric effect but without a hydrophilic residue) were added to the plating bath matrix but remained as solid particles on top of the plating bath surface. Accordingly, nitrobenzene was not water-soluble in a required amount in the plating bath matrix.

Example 4

30 mg/l of 4-nitrophenol were added to the plating bath matrix. The stability number of such a plating bath was 13. Accordingly, the stability of said plating bath against undesired decomposition of the plating bath was considered sufficient.

Example 5

40 mg/l of 4-nitrobenzoic acid were added to the plating bath matrix. The stability number of such a plating bath was 14. Accordingly, the stability of said plating bath against undesired decomposition of the plating bath was considered sufficient.

Example 6

50 mg/l of 3,5-dinitrobenzoic acid were added to the plating bath matrix. The stability number of such a plating bath was 17. Accordingly, the stability of said plating bath against undesired decomposition of the plating bath was considered sufficient.

Example 7

50 mg/l of 2,4-dinitrobenzoic acid were added to the plating bath matrix. The stability number of such a plating bath was 15. Accordingly, the stability of said plating bath against undesired decomposition of the plating bath was considered sufficient.

Example 8

54 mg/l of 2-hydroxy-3,5-dinitrobenzoic acid were added to the plating bath matrix. The stability number of such a plating bath was 15. Accordingly, the stability of said plating bath against undesired decomposition of the plating bath was considered sufficient.

Example 9

42.5 mg/l of 2-acetylbenzoic acid were added to the plating bath matrix. The stability number of such a plating bath was 12. Accordingly, the stability of said plating bath against undesired decomposition of the plating bath was considered sufficient.

Example 10 (Comparative)

In order to simulate a real life plating situation, an already used plating bath was used throughout examples 10 to 14. The already used plating bath had been prepared according to the composition of the plating bath matrix outlined in the General procedure. Throughout examples 10 to 14, the stability against undesired decomposition was determined according to the test outlined in the General procedure.

The stability against undesired bath decomposition for the already used plating bath without any stabilizing agents was tested in example 10. The stability number of such a plating bath was 6.

Example 11

40 mg/l of 4-nitrobenzoic acid were added to the already used plating bath according to example 10. The stability number of such a plating bath was 11. Accordingly, the stability of said plating bath against undesired decomposition of the plating bath was considered sufficient.

Example 12

40 mg/l of 4-nitrophenol were added to the already used plating bath according to example 10. The stability number of such a plating bath was 10. Accordingly, the stability of said plating bath against undesired decomposition of the plating bath was considered sufficient.

Example 13 (Comparative)

40 mg/l of sodium saccharin dihydrate were added to the already used plating bath according to example 10. The stability number of such a plating bath was 9.

Example 14

40 mg/l of 3-nitro benzene sulfonic acid were added to the already used plating bath according to example 10. The stability number of such a plating bath was 8.

The invention claimed is:

1. An aqueous acidic plating bath composition for electroless deposition of palladium, comprising
   (i) a source for palladium ions,
   (ii) a nitrogenated complexing agent for palladium ions,
   (iii) a reducing agent selected from the group consisting of formic acid, derivatives and salts thereof,
   (iv) a water-soluble stabilizing agent selected from the group consisting of aromatic compounds comprising at least two residues wherein at least one residue is a hydrophilic residue and at least one residue has a negative mesomeric effect, and
   wherein the at least one hydrophilic residue is selected from the group consisting of hydroxyl, carboxyl, sulfonate and salts thereof; and
   wherein the at least one residue having a negative mesomeric effect is selected from the group consisting of nitro, nitrile, acetyl, carboxyl and sulfonate.

2. The aqueous acidic plating bath composition according to claim 1 wherein the source for palladium ions is selected from the group consisting of palladium chloride, palladium nitrate, palladium acetate, palladium sulfate, palladium perchlorate, di-chlorodiethylenediamine palladium, dinitrodiethylenediamine palladium and diacetatodiethylenediamine palladium.

3. The aqueous acidic plating bath composition according to claim 1 wherein the concentration of palladium ions in the plating bath ranges from 0.5 to 500 mmol/l.

4. The aqueous acidic plating bath composition according to claim 1 wherein the nitrogenated complexing agent for palladium ions is selected from the group consisting of primary amines, secondary amines and tertiary amines.

5. The aqueous acidic plating bath composition according to claim 1 wherein a mole ratio of the nitrogenated complexing agent for palladium ions and palladium ions in the electroless plating bath ranges from 2:1 to 50:1.

6. The aqueous acidic plating bath composition according to claim 1 wherein the formic acid derivative is selected from the group consisting of esters of formic acid and substituted and unsubstituted amides of formic acid.

7. The aqueous acidic plating bath composition according to claim 1 wherein the concentration of the reducing agent ranges from 10 to 1000 mmol/l.

8. The aqueous acidic plating bath composition according to claim 1 wherein the pH-value ranges from 4 to 7.

9. The aqueous acidic plating bath composition according to claim 1 wherein the water-soluble stabilizing agent is selected from the group consisting of 2-nitrophenol, 3-nitrophenol, 4-nitrophenol, 3,5-dinitrophenol, 2,4-dinitrophenol, 2,4,6-trinitrophenol, 2-nitrobenzoic acid, 3-nitrobenzoic acid, 4-nitrobenzoic acid, 3,5-dinitrobenzoic acid, 2,4-dinitrobenzoic acid, 2,4,6-trinitrobenzoic acid, 2-hydroxy-3,5-dinitrobenzoic acid, 2-nitrobenzosulfonic acid, 3-nitrobenzosulfonic acid, 4-nitrobenzosulfonic acid, 3,5-dinitrobenzosulfonic acid, 2,4-dinitrobenzosulfonic acid, 2,4,6-trinitrobenzosulfonic acid, 2-acetylbenzoic acid, 3-acetylbenzoic acid, 4-acetylbenzoic acid, 3,5-diacetylbenzoic acid, 2,4-diacetylbenzoic acid, 2,4,6-triacetylbenzoic acid, 2-acetylphenol,3-acetylphenol, 4-acetylphenol, 3,5-diacetylphenol, 2,4-diacetylphenol, 2,4,6-triacetylphenol, 2-acetylbenzosulfonic acid, 3-acetylbenzosulfonic acid, 4-acetyl-benzosulfonic acid, 3,5-diacetylbenzosulfonic acid, 2,4-diacetylbenzosulfonic acid, 2,4,6-triacetylbenzosulfonic acid, 2-cyanobenzoic acid, 3-cyanobenzoic acid, 4-cyanobenzoic acid, 2-hydroxybenzonitrile, 3-hydroxybenzonitrile, 4-hydroxybenzonitrile, and their corresponding ammonium, sodium and potassium salts.

10. The aqueous acidic plating bath composition according to claim 1 wherein the water-soluble stabilizing agent is selected from the group consisting of 2-nitrobenzoic acid, 3-nitrobenzoic acid, 4-nitrobenzoic acid, 3,5-dinitrobenzoic acid, 2,4-dinitrobenzoic acid, 2,4,6-trinitrobenzoic acid, 2-hydroxy-3,5-dinitrobenzoic acid and their corresponding ammonium, sodium and potassium salts.

11. The aqueous acidic plating bath composition according to claim 1 wherein the concentration of the stabilizing agent ranges from 1 to 200 mg/l.

12. A method for electroless palladium plating comprising, in this order, the steps of
   a) providing a substrate having a metal surface,
   b) providing an aqueous acidic plating bath composition according to claim 1,
   c) contacting said substrate with said aqueous acidic plating bath composition and thereby depositing a layer of palladium onto the metal surface of the substrate.

13. The method for electroless palladium plating according to claim 12 wherein the substrate is contacted with the aqueous acidic plating bath composition at a temperature of 35 to 95° C. for 1 to 60 min in step c).

\* \* \* \* \*